(12) United States Patent  
Quarto

(10) Patent No.: US 8,310,272 B2  
(45) Date of Patent: Nov. 13, 2012

(54) METHOD AND SYSTEM FOR TESTING ELECTRIC AUTOMOTIVE DRIVE SYSTEMS

(75) Inventor: Mark Quarto, Sterling Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 431 days.

(21) Appl. No.: 12/511,825

(22) Filed: Jul. 29, 2009

(65) Prior Publication Data

US 2011/0025369 A1     Feb. 3, 2011

(51) Int. Cl.
    *G01R 31/34*     (2006.01)
    *G01R 31/40*     (2006.01)

(52) U.S. Cl. ............................... 324/765.01; 324/764.01

(58) Field of Classification Search ............. 324/765.01, 324/762.01–762.09, 764.01; 318/490; 180/65.29, 180/65.31; 701/102, 111
See application file for complete search history.

(56) References Cited

U.S. PATENT DOCUMENTS 6,291,987 B1 *   9/2001   Dean et al. ............... 324/764.01
8,047,317 B2 *   11/2011   Mari Curbelo et al. ..... 180/65.29

* cited by examiner

*Primary Examiner* — Tung X Nguyen

(74) *Attorney, Agent, or Firm* — Ingrassia Fisher & Lorenz, P.C.

(57) ABSTRACT

Various methods and systems for testing electric automotive drive systems are provided. The methods may be implemented with components with components that are used during normal operation of the automobile, such an inverter, an electric motor, and an electronic control system. One such method includes adjusting the frequency of a current pulsed input provided to an electric motor while monitoring the winding currents. Another method includes monitoring current flow during and after a direct current (DC) pulse is generated by switches within an inverter. A further method includes monitoring current flow while a deactivation signal is provided to the switches and during individual activation of the switches.

20 Claims, 5 Drawing Sheets

METHOD AND SYSTEM FOR TESTING ELECTRIC AUTOMOTIVE DRIVE SYSTEMS

TECHNICAL FIELD

The present invention generally relates to automobiles, and more particularly relates to a method and system for testing various components within electric automotive drive systems.

BACKGROUND OF THE INVENTION

In recent years, advances in technology, as well as ever-evolving tastes in style, have led to substantial changes in the design of automobiles. One of the changes involves the complexity of the electrical and drive systems within automobiles, particularly alternative fuel vehicles, such as hybrid, battery electric, and fuel cell vehicles. Such alternative fuel vehicles typically use one or more electric motors, perhaps in combination with another actuator, to drive the wheels.

If the vehicle exhibits performance symptoms that indicate a problem with one of the drive components, it is difficult to determine exactly which component is not operating properly. Conventional testing methods often require at least partial disassembly of the vehicle, which significantly increases maintenance costs.

Accordingly, it is desirable to provide a method and system for testing an electric automotive drive system that stresses the various components of the system to expose possible future failures. Additionally, it is desirable to provide such a method and system that allows the components to be tested without having to remove any of the components. Furthermore, other desirable features and characteristics of the present invention will become apparent from the subsequent description taken in conjunction with the accompanying drawings and the foregoing technical field and background.

SUMMARY OF THE INVENTION

A method for testing an electric motor is provided. The electric motor has a first component with a plurality of windings and a second component rotatably coupled to the first component. A current pulsed input is provided to the plurality of windings such that the second component does not rotate relative to the first component. The current pulsed input has a frequency causing the windings to vibrate. The frequency of the current pulsed input is adjusted. An amount of current flowing through each of the plurality of windings is monitored during the providing of the current pulsed input and the adjusting of the frequency of the current pulse. An indication of an electrical short within the plurality of windings is generated if the amount of current flowing through any of the plurality of windings exceeds a predetermined amount.

A method for testing a multiple-phase circuit including an inverter coupled to an electric motor is provided. First and second switches in the inverter are activated. The first and second switches have respective first and second diodes coupled thereto in an anti-parallel configuration. Current flow through the first and second switches is monitored while the first and second switches are activated. The first and second transistors are deactivated. Current flow through respective diodes coupled to a third and a fourth of the plurality of transistors in an anti-parallel configuration is monitored after the deactivating of the first and second transistors.

A method for testing a power inverter including a plurality of transistors is provided. A deactivation signal is provided to the plurality of transistors. Current flow through each of the plurality of transistors is monitored. A first error signal is generated if the current flow through any of the plurality of transistors is greater than a predetermined threshold while the deactivation signal is provided to the plurality of transistors. An activation signal is individually provided to each of the plurality of transistors. A second error signal is generated if the current flow through any of the plurality of transistors is greater than the predetermined threshold while the activation signal is being provided to any of the plurality of transistors.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

Figure 1:
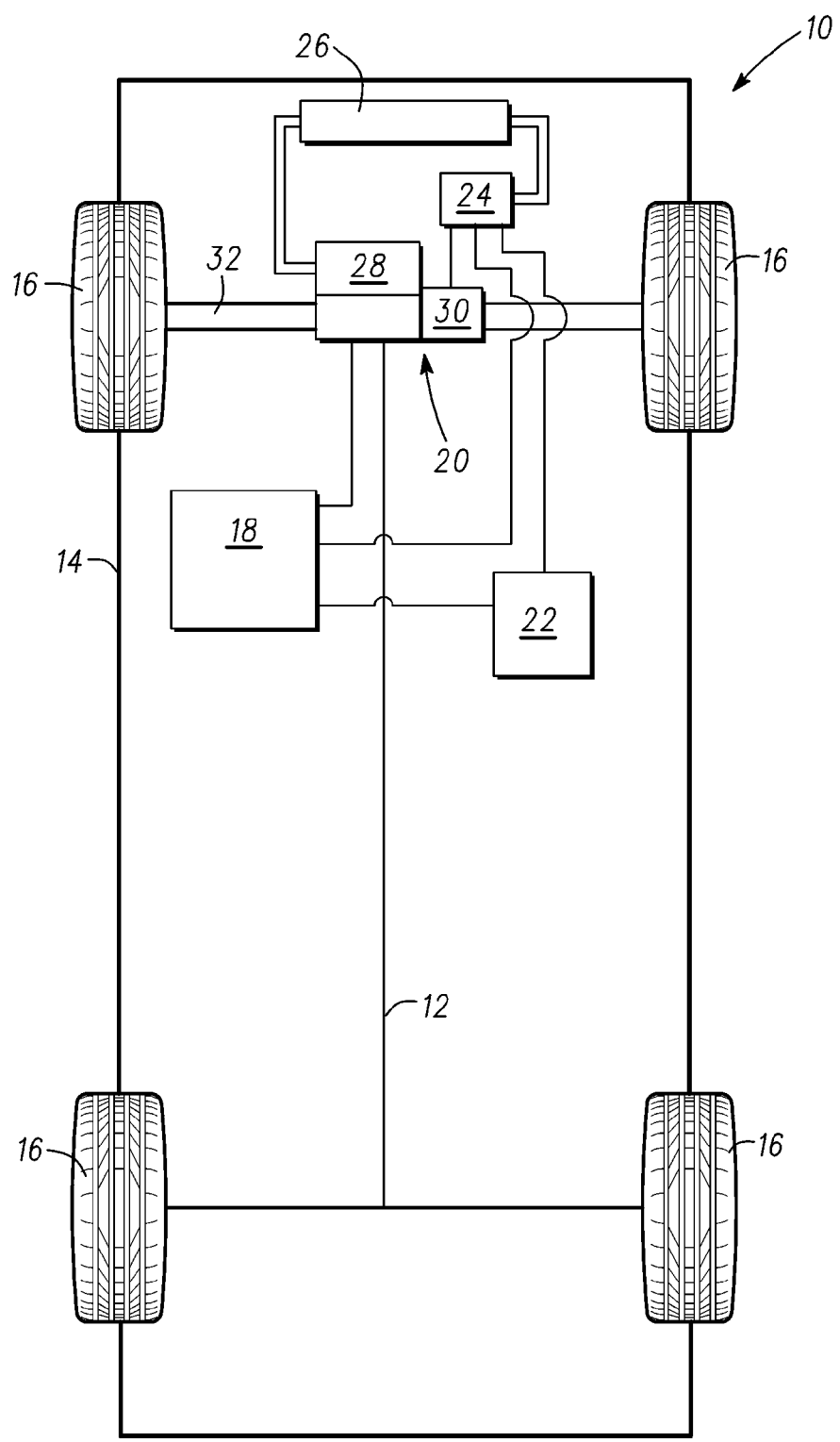
FIG. 1 is a schematic view of an exemplary automobile according to one embodiment of the present invention.

The following detailed description is merely exemplary in nature and is not intended to limit the invention or the application and uses of the invention. Furthermore, there is no intention to be bound by any expressed or implied theory presented in the preceding technical field, background, and brief summary, or the following detailed description.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Further, various components and features described herein may be referred to using particular numerical descriptors, such as first, second, third, etc., as well as positional and/or angular descriptors, such as horizontal and vertical. However, such descriptors may be used solely for descriptive purposes relating to drawings and should not be construed as limiting, as the various components may be rearranged in other embodiments. It should also be understood that FIGS. 1-6 are merely illustrative and may not be drawn to scale.

FIG. 1 to FIG. 6 illustrate various methods and systems for testing electric automotive drive systems. The methods may be implemented with components that are used during normal operation of the automobile, such an inverter, an electric motor, and an electronic control system. However, in some embodiments, the methods may be initiated using off-board control devices, such as a serial data tool.

In one embodiment, a method for testing an electric motor for shorts (e.g., shorts between the windings within the motor) is provided. A current pulsed input is applied to the windings (e.g., by switching current positive in one cycle and negative in the next cycle to produce a motor zero torque output), in one embodiment, in such a way that the motor is not actuated (i.e., the rotor of the motor does not rotate relative to the stator of the motor). The frequency of the current pulsed input causes the windings to vibrate or move. The frequency is adjusted. The winding currents are monitored for atypical increases, which may be indicative of, for example, inter-phase shorts.

In another embodiment, a method for testing a multiple-phase circuit, including the inverter and the electric motor, for open circuits is provided. A first pair of switches in the inverter is briefly activated with a direct current (DC) pulse that provides the windings with a positive cycle and then a negative cycle (i.e., a zero torque command) to prevent motor rotation. Current flow through the first pair of switches is monitored during the DC pulse, and current flow through respective diodes coupled to a second pair of switches is monitored after the DC pulse. If the monitored currents are below predetermined levels, it may indicate the presence of one or more open circuits in the circuit.

In a further embodiment, a method for testing a power inverter having a plurality of transistors is provided. A deactivation signal is provided to the plurality of transistors, while current flow through the transistors is monitored. An error signal is generated if the current flow through any of the transistors is greater than a predetermined threshold. An activation signal is then individually provided to each of the transistors. An error signal is generated if the current flow through any of the transistors is greater than the predetermined threshold while the activation signal is provided.

FIG. 1 illustrates a vehicle (or "automobile") 10, according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The automobile 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine (i.e., such as in a hybrid electric vehicle (HEV)), and an electric motor.

In the exemplary embodiment illustrated in FIG. 1, the automobile 10 is an HEV, and further includes an actuator assembly 20, a battery (or a DC power supply) 22, a power converter assembly (e.g., an inverter or inverter assembly) 24, and a radiator 26. The actuator assembly 20 includes a combustion engine 28 and an electric motor/generator (or motor) 30.

Still referring to FIG. 1, the combustion engine 28 and/or the electric motor 30 are integrated such that one or both are mechanically coupled to at least some of the wheels 16 through one or more drive shafts 32. In one embodiment, the automobile 10 is a "series HEV," in which the combustion engine 28 is not directly coupled to the transmission, but coupled to a generator (not shown), which is used to power the electric motor 30. In another embodiment, the automobile 10 is a "parallel HEV," in which the combustion engine 28 is directly coupled to the transmission by, for example, having the rotor of the electric motor 30 rotationally coupled to the drive shaft of the combustion engine 28.

The radiator 26 is connected to the frame at an outer portion thereof and although not illustrated in detail, includes multiple cooling channels therein that contain a cooling fluid (i.e., coolant) such as water and/or ethylene glycol (i.e., "anti-freeze") and is coupled to the engine 28 and the inverter 24.

Referring again to FIG. 1, in the depicted embodiment, the inverter 24 receives and shares coolant with the electric motor 30. However, other embodiments may use separate coolants for the inverter 24 and the electric motor 30. The radiator 26 may be similarly connected to the inverter 24 and/or the electric motor 30.

The electronic control system 18 is in operable communication with the actuator assembly 20, the high voltage battery 22, and the inverter 24. Although not shown in detail, the electronic control system 18 includes various sensors and automotive control modules, or electronic control units (ECUs), such as an inverter control module, a motor controller, and a vehicle controller, and at least one processor and/or a memory which includes instructions stored thereon (or in another computer-readable medium) for carrying out the processes and methods as described below.

Figure 2:
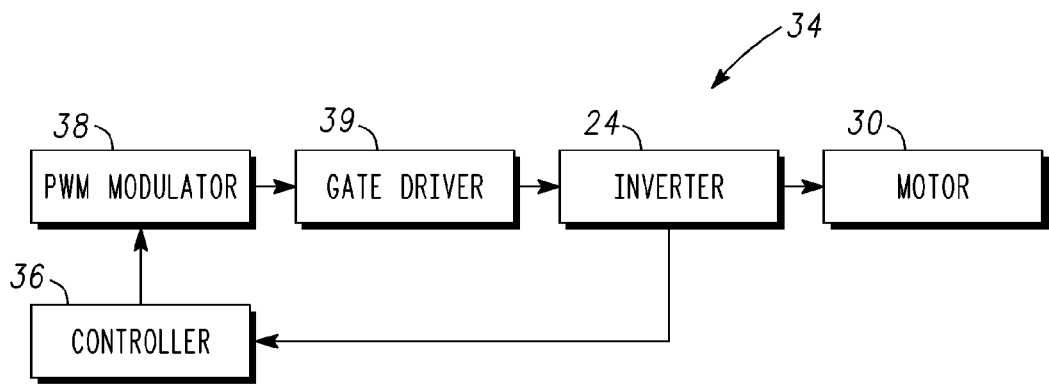
FIG. 2 is a block diagram of a voltage source inverter system within the automobile of FIG. 1.

Referring to FIG. 2, a voltage source inverter system (or electric drive system) 34, in accordance with an exemplary embodiment of the present invention, is shown. The voltage source inverter system 34 includes a controller 36 in operable communication with a Pulse Width Modulation (PWM) modulator 38 (or a pulse width modulator) and the inverter 24 (at an output thereof). The PWM modulator 38 is coupled to a gate driver 39, which in turn has an input coupled to an input of the inverter 24. The inverter 24 has a second output coupled to the motor 30. The controller 36 and the PWM modulator 38 may be integral with the electronic control system 18 shown in FIG. 1.

Figure 3:
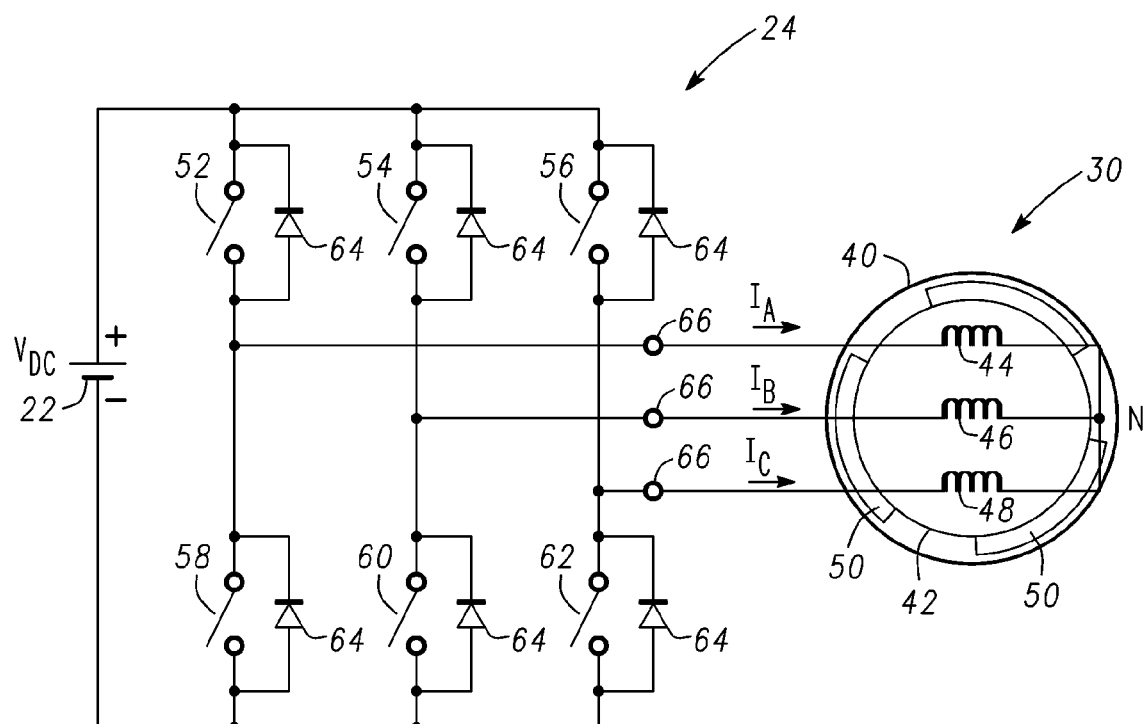
FIG. 3 is a schematic view of a voltage source, an inverter, and an electric motor within the automobile of FIG. 1.

FIG. 3 schematically illustrates the battery 22, the inverter 24 (or power converter), and the motor 30 of FIGS. 1 and 2 in greater detail. The inverter 24 includes a three-phase circuit coupled to the motor 30. More specifically, the inverter 24 includes a switch network having a first input coupled to the battery 22 (i.e., a voltage source (Vdc)) and an output coupled to the motor 30. Although a single voltage source is shown, a distributed DC link with two series sources may be used.

As will be appreciated by one skilled in the art, the electric motor 30, in one embodiment, includes a stator assembly 40 (including conductive coils or windings) and a rotor assembly 42 (including a ferromagnetic core and/or magnets), as well as a transmission and a cooling fluid (not shown). The stator assembly 40 includes a plurality (e.g., three) conductive coils or windings 44, 46, and 48, each of which is associated with one of three phases of the electric motor 30, as is commonly understood. The rotor assembly 42 includes a plurality of magnets 50 and is rotatably coupled to the stator assembly 40, as is commonly understood. The magnets 50 may include multiple electromagnetic poles (e.g., sixteen poles), as is commonly understood. It should be understood that the description provided above is intended as example of one type of electric motor that may be used. One skilled in the art will appreciate that the techniques described below may be applied to any type of electric motor.

The switch network comprises three pairs (a, b, and c) of series switches with antiparallel diodes (i.e., antiparallel to each switch) corresponding to each of the phases of the motor 30. Each of the pairs of series switches comprises a first switch, or transistor, (i.e., a "high" switch) 52, 54, and 56 having a first terminal coupled to a positive electrode of the voltage source 22 and a second switch (i.e., a "low" switch) 58, 60, and 62 having a second terminal coupled to a negative electrode of the voltage source 22 and a first terminal coupled to a second terminal of the respective first switch 52, 54, and 56.

As is commonly understood, each of the switches 52-62 may be in the form of individual semiconductor devices such as insulated gate bipolar transistors (IGBTs) within integrated circuits formed on semiconductor (e.g. silicon) substrates (e.g., die). As shown, a diode 64 is connected in an antiparallel configuration (i.e., "flyback diodes") to each of the switches 52-62. As such, each of the switches 52-62 and the respective diode 64 may be understood to form a switch-diode pair or set, six of which are included in the embodiment shown.

Still referring to FIG. 3, the inverter 24 and/or the motor 30 includes a plurality of current sensors 66, each of which is configured to detect the flow of current through a respective one of the windings 44, 46, and 48 of the motor 30 (and/or through the respective switches 52-62 or diodes 64).

During normal operation (i.e., driving), referring to FIGS. 1 and 2, the automobile 10 is operated by providing power to the wheels 16 with the combustion engine 28 and the electric motor 30 in an alternating manner and/or with the combustion engine 28 and the electric motor 30 simultaneously. In order to power the electric motor 30, DC power is provided from the battery 22 (and, in the case of a fuel cell automobile, a fuel cell) to the inverter 24, which converts the DC power into AC power, before the power is sent to the electric motor 30. As will be appreciated by one skilled in the art, the conversion of DC power to AC power is substantially performed by operating (i.e., repeatedly switching) the transistors within the inverter 24 at a "switching frequency," such as, for example, 12 kilohertz (kHz). Generally, the controller 36 produces a Pulse Width Modulation (PWM) signal for controlling the switching action of the inverter 24. The inverter 24 then converts the PWM signal to a modulated voltage waveform for operating the motor 30.

According to one aspect of the present invention, a method and/or system is provided for determining whether the windings 44, 46, and 48 within the motor 30 contain, for example, an inter-phase short (i.e., a short circuit between any of the phases or an intra-phase short (i.e., a short within one winding). The method and system may be used, along with diagnostic fault codes and drivability symptoms, to confirm whether the electric motor 30, which may be located within a transmission or transaxle of the automobile 10, is to be removed from for further testing and/or replacement.

In one embodiment, a DC pulsed input (or pulse) that provides the windings with a positive cycle and then a negative cycle is provided to the windings 44, 46, and 48 in such a way that the motor 30 is not actuated (i.e., a zero torque command). The DC pulse has a frequency. The frequency of the DC pulse input causes the windings 44, 46, and 48 to move or vibrate. The frequency is adjusted. An amount of current flowing through each of the plurality of windings is monitored. An indication of an electrical short within the plurality of windings is generated if the amount of current flowing through any of the plurality of windings in response to the adjusting of the frequency of the DC pulse exceeds a predetermined amount.

Figure 4:
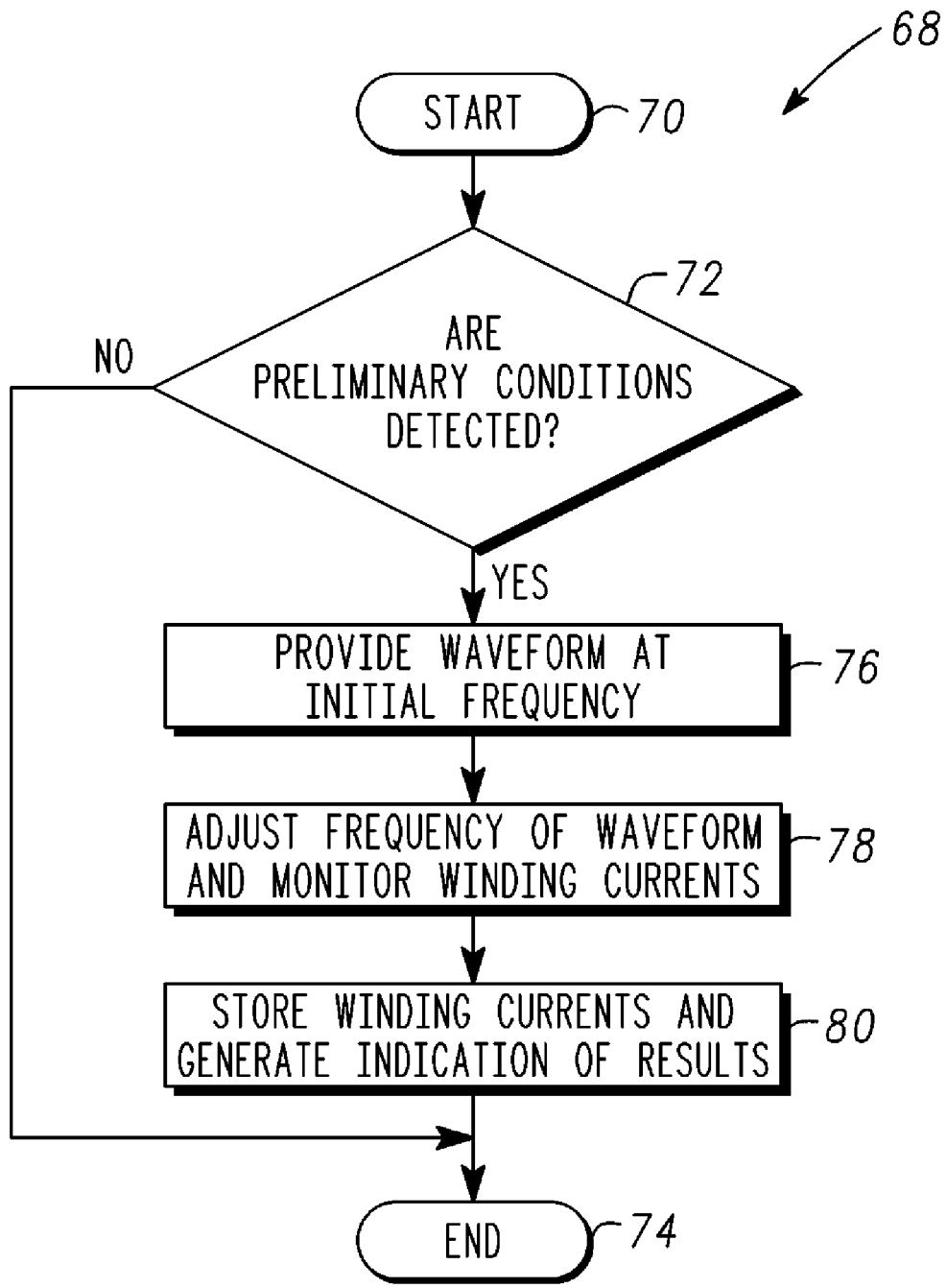
FIG. 4 is a flow chart illustrating a method for testing an electric motor, according to one embodiment of the present inventions.

FIG. 4 illustrates such a method (or process) 68, in accordance with one embodiment of the present invention. As shown, at step 70, the process is initiated, for example, by an off-board serial data tool (i.e., a scan tool), as is commonly understood, that is in operable communication with the electronic control system 18 (FIG. 1).

At step 72, a series of preliminary conditions are checked to determine if the automobile 10 is in a condition suitable to undergo the process, or test. The preliminary conditions may be checked by the serial data tool and/or the electronic control system 18. Examples of required preliminary conditions include: the automobile 10 is "keyed-on" (i.e., the ignition switch is in an ON position), the gear selector (not shown) is in "PARK," the wheel speed of all wheels 16 is zero, the state of charge of the battery 22 is above a predetermined value, the temperatures (as measured by non-illustrated temperatures sensors) within the inverter 24 and the motor 30 are below predetermined thresholds, and various safety mechanisms (e.g., high voltage interlocks) on the automobile 10 are intact. In some embodiments, the preliminary conditions may also include a pre-charging of the high voltage system (i.e., the battery 22).

If the preliminary conditions are not detected, the method 68 proceeds to step 74, and is halted. Although not shown, a suitable indication (e.g., on the serial data tool) may be generated to alert the user to the fact the automobile 10 is not in a condition suitable to perform the test.

After the preliminary conditions are detected, at step 76, the electronic control system 18 (and/or the inverter control module) operates the switches 52-62 such that a DC pulse is generated and provided to the windings 44, 46, and 48. The DC pulse is provided such that the windings are provided with a positive cycle and then a negative cycle (e.g., current flow reverses direction). As will be appreciated by one skilled in the art, the switches 52-62 may be operated under a zero torque command such that no torque is generated between the windings 44, 46, 48 and the rotor 42 within the motor 30, and thus, the rotor 42 does not rotate relative to the stator 40. In one embodiment, the pulsed input has an initial (or first) frequency that is approximately 20% of the maximum frequency suitable for the particular stator 40 that is used, as is commonly understood.

The current input that is provided may minimize bus voltage reduction or sag during testing (e.g., place the system in a state to generate a waveform), as well as reduce the number of semiconductor switching cycles and associated transients. Motor drive ON time shall permit high operating current at each given stator frequency. Although provided at zero torque command, the oscillating nature of the current causes the windings 44, 46, and 48 to vibrate or "wiggle" (or otherwise move within the stator 40) at the same frequency at which the current pulse is provided.

At step 78, the frequency of the DC pulsed input is adjusted in a staggered manner while the stator (or winding) currents are monitored (i.e., the monitoring of the winding current may begin before the frequency is adjusted). In one embodiment, after the current is provided at the initial frequency for a predetermined duration (e.g., 0.5 seconds), the frequency is increased to approximately 40% of the maximum stator frequency (or a second frequency). After a second predetermined duration, which may be the same as the first duration, the frequency is increased to 60% of the maximum stator frequency (or a third frequency). After a third predetermined duration (e.g., 0.5 seconds), the frequency is increased to 80% of the maximum stator frequency (or a fourth frequency) for a fourth predetermined duration (e.g., 0.5 seconds).

The adjusting of the frequency is then reversed in a similar manner. That is, the frequency is reduced back to the third frequency for the third duration, reduced again to the second frequency for the second duration, and then further reduced to the first frequency.

As will be appreciated by one skilled in the art, the adjusting of the current frequency described above alters the vibrations or movements of the windings 44, 46, and 48 within stator 40 (e.g., changes the frequency of vibration). If the vibrations cause any of the windings 44, 46, and 48 to contact any of the other windings 44, 46, and 48 (i.e., an inter-phase short) or to contact itself (i.e., an intra-phase short), the current flow through the respective windings 44, 46, and 48 will increase substantially.

For example, if the current flow through each of the windings 44, 46, and 48 when an open loop voltage command creates a waveform that initially generates approximately 50 amperes (A), an inter-phase short caused by the vibrations may cause the current flow through the shorted phases to increase to approximately 90 A.

At step 80, any such increases (i.e., over a predetermined threshold) in winding current is detected by the current sensors 66 and stored, for example, in the electronic control system 18 (and/or the serial data tool). The information stored may include the current through each of the windings indexed with the switching cycles of the individual switches 52-62, or switch pairs.

As will be appreciated by one skilled in the art, the cyclic DC pulse switching of a particular pair of the switches 52-62 causes current flow through a particular pair of the windings 44, 46, and 48. For example, the activation of switch 52 and switch 60 causes current to flow through windings 44 and 46 in the first cycle, while the activation of switch 58 and 54 in the second switching cycle causes current to flow through windings 44 and 48 without producing motor rotation (i.e., zero torque command). As such, the particular windings 44, 46, and 48 that are causing the inter-phase shorts may be determined. Although the embodiment above is described as using a DC pulse, it should be understood that in other embodiments, an alternating current (AC) waveform may be used instead, in which case it may useful to provide a locking mechanism to prevent actuation of the motor 30 and/or the transmission of the automobile 10.

The serial data tool may then provide a signal or indication (e.g., a FAULT message) to the user as to the presence or absence of an inter-phase short. The indication may also provide which of the windings 44, 46, and 48 may need to be repaired or replaced. Alternatively, or additionally, the indication may be generated by device on-board the automobile 10, such as on the dashboard or the instrument "cluster."

According to another aspect of the present invention, a method and/or system is provided for determining whether there is an open circuit in the high voltage three-phase circuit within the electric motor 30 stator windings 44, 46, and 48 or the power inverter 24 drive circuit. The following test may be used on an induction or permanent machine (i.e., motor). When coupled with diagnostic trouble codes and drivability symptoms, the test may confirm whether or not the motor 30, which is often located within a transmission or transaxle, or the inverter 24 are to be removed from the automobile 10 for further testing and/or replacement.

In one embodiment, first and second switches in the inverter are activated. The first and second switches have respective first and second diodes coupled thereto in an anti-parallel configuration. Current flow through the first and second switches is monitored while the first and second switches are activated. The first and second transistors are deactivated. Current flow through respective diodes coupled to a third and a fourth of the plurality of transistors in an anti-parallel configuration is monitored after the deactivating of the first and second transistors.

Figure 5:
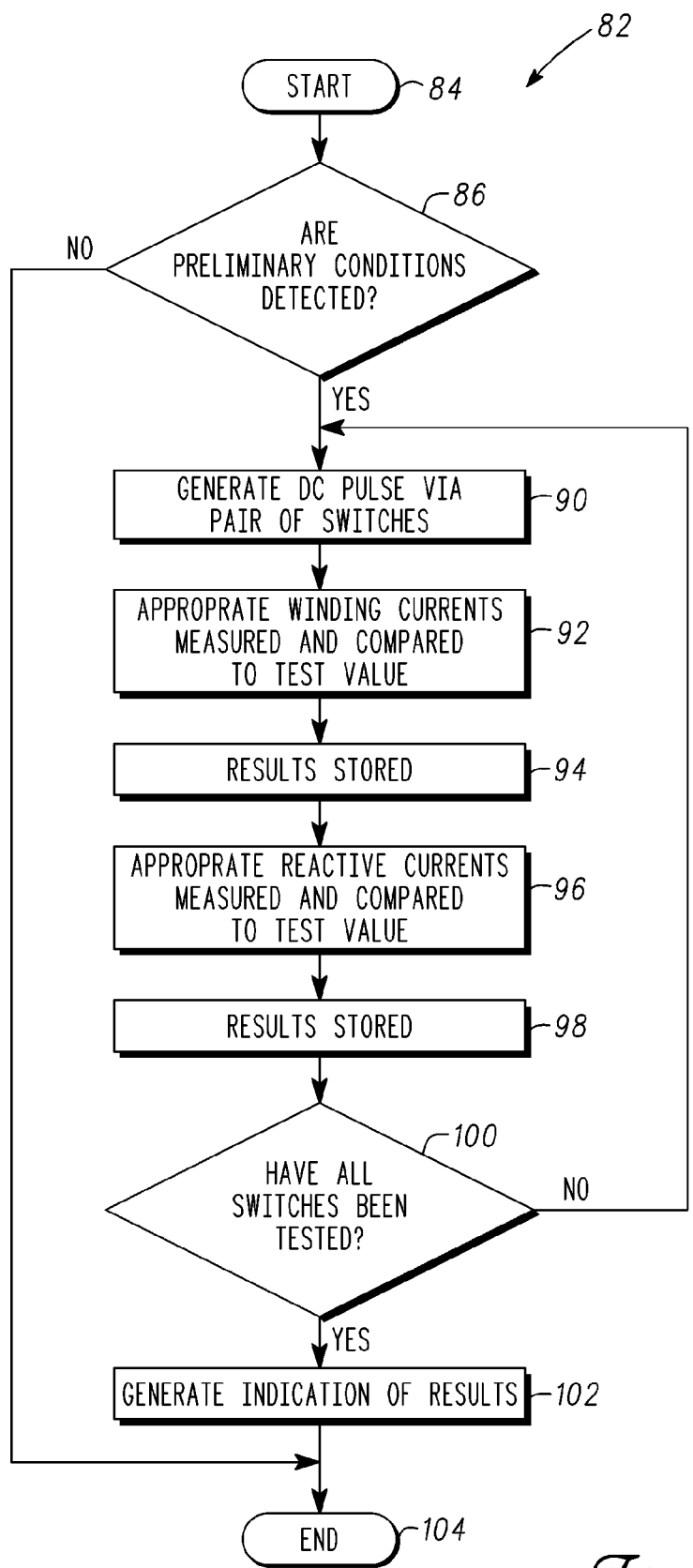
FIG. 5 is a flow chart illustrating a method for testing a multi-phase circuit, according to another embodiment of the present invention.

FIG. 5 illustrates such a method 82, in accordance with one embodiment of the present invention. As shown, at step 84, the process is initiated, by for example, an off-board serial data tool (i.e., a scan tool) that is in operable communication with the electronic control system 18 (FIG. 1).

At step 86, a series of preliminary conditions are checked to determine if the automobile 10 is in a condition suitable to undergo the process. The preliminary conditions may be checked by serial data tool and/or the electronic control system 18. Examples of required preliminary conditions include: the automobile 10 is "keyed-on" (i.e., the ignition switch is in an ON position), the gear selector (not shown) is in "PARK," the wheel speed of all wheels is zero, the state of charge of the battery 22 is above a predetermined value, the temperatures (as measured by non-illustrated temperatures sensors) within the inverter 24 and the motor 30 are below predetermined thresholds, and various safety mechanisms (e.g., high voltage interlocks) on the automobile 10 are intact. In some embodiments, the preliminary conditions may also include a pre-charging of the high voltage system (i.e., the battery 22).

If the preliminary conditions are not detected, the method 82 proceeds to step 88, and is halted. Although not shown, a suitable indication (e.g., on the serial data tool) may be generated to alert the user to the fact the automobile 10 is not in a condition suitable to perform the test.

After the preliminary conditions are detected, at the serial data tool and/or the electronic control system 18 commands the motor controller to commence switching the switches 52-62 (i.e., the motor drive circuit).

At step 90 (a first portion of the test) the power inverter controller commands a first pair of the switches 52-62, such as switch 54 and switch 58, "ON" for a predetermined duration (e.g., 0.5 seconds), thus generating a DC pulse through the associated windings (e.g., winding 44 and winding 48). The electrical current may be limited to a safe level for the motor 30, which may depend on the winding specifications of the particular motor used.

At step 92, the winding currents through the appropriate windings are measured and compared to a predetermined value, or test value, (e.g., 10 Å) by the serial data tool and/or the electronic control system 18. In one embodiment, at step 94, the results of the first portion of test are routed to and stored in memory (i.e., either in the serial data tool and/or the electronic control system).

If the winding currents for the appropriate windings when the switches are ON are above the test value, it is indicative of the lack of an open circuit within the first pair of switches. If the winding currents are below the test value (e.g., 0 A), it is indicative of the presence of such an open circuit.

As will be appreciated one skilled in the art, after the first pair of switches is deactivated, it is expected that a reactive current will continue to flow through the appropriate windings in the same direction, due to the inductive nature of the motor load, cause the phase currents to continue to flow. The reactive current also flows through a second pair of the switches, such as switch 58 and switch 56, or more particularly, the diodes 64 associate with those switches. The reactive current will only flow measurably if the diodes 64 associated with the second pair of switches are operating properly (i.e., are intact).

At step 96 (a second portion of the test), the reactive phase winding currents through the appropriate diodes 64 are measured and compared to a predetermined value (e.g., 0.5 A) by the serial data tool and/or the electronic control system 18. In one embodiment, at step 98, the results of the second portion of the test are routed to and stored in memory.

If the reactive currents for the appropriate windings after the switches are turned OFF are above the test value, it is indicative of the lack of an open circuit within the diodes 64 associated with the first pair of switches. If the winding currents are below the test value (e.g., 0 A), it is indicative of the presence of such an open circuit (e.g., the diodes 64 are not intact).

At step 100, if all of the switches (and diodes) have not been tested, the method 82 returned to step 90 and another pair of switches is tested as described above.

If all of the switches have been tested, the method proceeds to step 102 at which point an indication of the results of the test(s) is provided and displayed to the user (e.g., via the serial data tool and/or the instrument cluster).

For each pair switches and pair of diodes associated with the second pair of switches, possible results for the test(s) may include the following: 1) The measured currents for both portion portions of the test are above the respective thresholds, in which case a PASS signal may be generated for both portions (i.e., no open circuit is present in the switches, the diodes, or the windings); 2) The measured currents for both portions of the test are below the respective thresholds, in which a FAIL signal may be generated for both portions (such results may prompt the user to manually test the windings in the motor using an ohmmeter or continuity tester to determine if an open circuit is present in either the motor and/or the inverter or the wires connected to the inverter); 3) The measured current for the first portion of the test is below the respective threshold, and the measured current for the second portion is above the respective threshold. In such a case, a FAIL signal may be generated for the first portion of the test, and a PASS signal may be generated for the second portion of the test (i.e.,.. no open circuit is present in the windings and the diodes, but an open circuit is present in the switches); or 4) The measured current for the first portion of the test is above the respective threshold, and the measured current for the second portion is below the respective threshold. In such a case, a PASS signal may be generated for the first portion of the test, and a FAIL signal may be generated for the second portion of the test (i.e., no open circuit is present in the windings and the switches, but an open circuit is present in the diodes).

In manner similar to that described above, because the switching of a particular pair of the switches 52-62 causes current flow through a particular pair of the windings 44, 46, and 48, the location of any detected open circuits may be easily determined.

In one embodiment, the serial data tool and/or the electronic control system 18 has the ability to indicate the highest amperage levels captured during the tests in conjunction with a PASS/FAIL message that create absolute criteria to eliminate subjective errors. Diagnostic trouble codes associated with power inverter or electric machine failure may also be stored in the appropriate controller and retrieved by the serial data tool to assist in the analysis and diagnosis of the symptom.

According to another aspect of the invention, a method and/or system is provided for determining whether any of the switches and/or diodes is continuously biased ON. This test, coupled with diagnostic trouble codes and drivability symptoms, will assist field technicians in confirming whether a power inverter is to be removed from a vehicle for further testing and/or replacement. For the purposes of the test, it may be assumed that no open circuits are present in the motor 30 or the inverter 24.

In one embodiment, a deactivation signal is provided to the plurality of transistors. Current flow through each of the plurality of transistors (i.e., each of which is associated with a phase of the motor) is monitored. A first error signal is generated if the current flow through any of the plurality of transistors is greater than a predetermined threshold while the deactivation signal is provided to the plurality of transistors. An activation signal is individually provided to each of the plurality of transistors. A second error signal is generated if the current flow through any of the plurality of transistors is greater than the predetermined threshold while the activation signal is being provided to any of the plurality of transistors.

Figure 6:
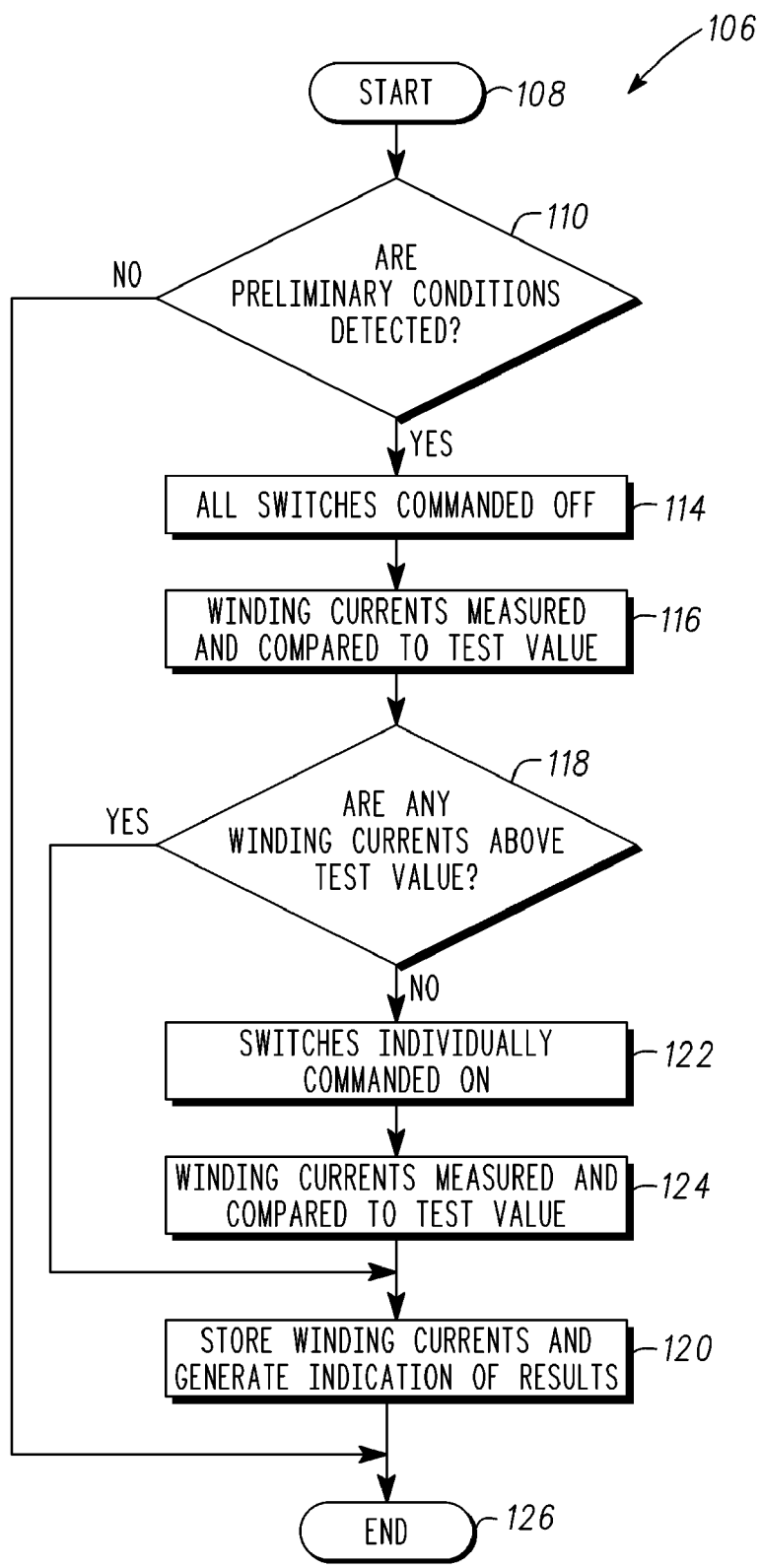
FIG. 6 is a flow chart illustrating a method for testing a power inverter, according to a further embodiment of the present invention.

FIG. 6 illustrates such a method 106, in accordance with one embodiment of the present invention. As shown, at step 108, the process is initiated, by for example, and off-board serial data tool (i.e., a scan tool) that is in operable communication with the electronic control system 18 (FIG. 1).

At step 110, a series of preliminary conditions are checked to determine if the automobile 10 is in a condition suitable to undergo the process. The preliminary conditions may be checked by serial data tool and/or the electronic control system 18. Examples of required preliminary conditions include: the automobile 10 is "keyed-on" (i.e., the ignition switch is in an ON position), the gear selector (not shown) is in "PARK," the wheel speed of all wheels is zero, the state of charge of the battery 22 is above a predetermined value, the temperatures (as measured by non-illustrated temperatures sensors) within the inverter 24 and the motor 30 are below predetermined thresholds, and various safety mechanisms (e.g., high voltage interlocks) on the automobile 10 are intact. In some embodiments, the preliminary conditions may also include a pre-charging of the high voltage system (i.e., the battery 22).

If the preliminary conditions are not detected, the method 106 proceeds to step 112, and is halted. Although not shown, a suitable indication (e.g., on the serial data tool) may be generated to alert the user to the fact the automobile 10 is not in a condition suitable to perform the test.

After the preliminary are detected, at step 114, the electronic control system 18 biases output of the switches 52-62 to zero (i.e., the switches are commanded OFF).

At step 116, the winding currents are measured and compared to a predetermined threshold, or test value, (e.g., ~0 A). If any of the winding currents are above the predetermined threshold, it is indicative of more than one failure. That is, as is commonly understood, in order for a substantial amount of current to flow through any of the windings 44, 46, and 48, at least two of the switches 52-62 or the respective diodes 64 must be biased on. For example, in order for current to flow through winding 44 and winding 46, switch 52 and switch 60 (and/or the respective diodes 64) must be biased on.

If any of the current windings are above the threshold, at step 118, the method 106 proceeds to step 120, at which point the results are stored in memory and an indication of the results is generated in a manner similar to that described above (e.g., via the serial data tool and/or the electronic control system 18).

If all of the current windings are below the threshold, at step 122, each of the switches 52-62 is individually switched ON and commanded to a predetermined current value (e.g., 10 A) with an open loop voltage command. At step 124, the winding currents are measured and compared to the predetermined threshold. The method 106 then proceeds to step 120, and subsequently, step 126 at which point the method ends.

If during the individual operation of the switches 52-62 any of the winding currents is above the threshold, it is indicative a switch and/or an associated diode is in a failed state (i.e., continuously biased ON). For example, if the activation of switch 52 results in the current in winding 44 to be above the threshold, it can be deduced that switch 60 or 62 is continuously biased on, or switch 58 is in a shorted state. As such, the serial data tool and/or the electronic control system may be able to indicate to the user which particular switch or diode has failed.

In one embodiment, the serial data tool and/or the electronic control system 18 has the ability to indicate the highest amperage levels captured during the tests in conjunction with a PASS/FAIL message that create absolute criteria to eliminate subjective errors. Diagnostic trouble codes associated with power inverter or electric machine failure may also be stored in the appropriate controller and retrieved by the serial data tool to assist in the analysis and diagnosis of the symptom.

One advantage of the methods and systems described above is that they allow various aspects of the electrical system and/or drive system of the automobile to be tested using on-board components, as in some embodiments, the methods may be initiated through the electronic control system without the serial data tool. Thus, the methods may be implemented either before the vehicle is sold or after it is sold and is in the owner's possession. Another advantage is that the methods allow the respective tests to be performed while minimizing, if not eliminating, the need to disassemble any portion of the vehicle. As a result, maintenance costs are reduced.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for testing a multiple-phase circuit comprising an inverter coupled to an electric motor, the method comprising:
    activating first and second switches of a plurality of switches in the inverter, the first and second switches having respective first and second diodes coupled thereto;
    monitoring current flow through the first and second switches while the first and second switches are activated;
    deactivating the first and second switches;
    monitoring current flow through respective diodes coupled to a third switch and a fourth switch of the plurality of switches after the deactivating of the first and second switches, wherein the first and second switches and the respective diodes coupled to the third and fourth switches are associated with a first set of a plurality of windings; and
    generating a signal representative of whether there is an open circuit in the inverter based on a first comparison between the current flow through the first and second switches when the first and second switches are activated and a first predetermined threshold and a second comparison between the current flow through the respective diodes coupled to the third and fourth switches after the deactivating of the first and second switches and a second predetermined threshold.

2. The method of claim 1, wherein the step of generating a signal comprises:
    generating a signal representative of a lack of an open circuit amongst the first and second switches, the respective diodes coupled to the third and fourth switches, and the first set of the plurality of the windings if the current flow through the first and second switches when the first and second switches are activated is greater than a first predetermined threshold and the current flow through the respective diodes coupled to the third and fourth switches after the deactivating of the first and second switches is greater than a second predetermined threshold.

3. The method of claim 1, wherein the step of generating a signal comprises:
    generating a signal representative of a presence of an open circuit amongst the first and second switches, the respective diodes coupled to the third and fourth switches, and the first set of the plurality of the windings if the current flow through the first and second switches when the first and second switches are activated is not greater than a first predetermined threshold and the current flow through the respective diodes coupled to the third and fourth switches after the deactivating of the first and second switches is not greater than a second predetermined threshold.

4. The method of claim 1, wherein the step of generating a signal comprises:
    generating a signal representative of a presence of an open circuit within at least one of the first and second switches and the lack of an open circuit amongst the respective diodes coupled to the third and fourth switches and the first set of the plurality of the windings if the current flow through the first and second switches when the first and second switches are activated is not greater than a first predetermined threshold and the current flow through the respective diodes coupled to the third and fourth switches after the deactivating of the first and second switches is greater than a second predetermined threshold.

5. The method of claim 1, wherein the step of generating a signal comprises:
    generating a signal representative of a lack of an open circuit within the first set of the plurality of the windings and the presence of an open circuit amongst the respective diodes coupled to the third and fourth switches if the current flow through the first and second switches when the first and second switches are activated is greater than a first predetermined threshold and the current flow through the respective diodes coupled to the third and fourth switches after the deactivating of the first and second switches is not greater than a second predetermined threshold.

6. The method of claim 1, wherein the multiple phase circuit is on-board an automobile, and the activating and the deactivating of the first and second switches and the monitoring of the current are performed by a processing system on-board the automobile.

7. The method of claim 1, wherein the plurality of switches comprises a plurality of transistors.

8. The method of claim 7, wherein:
the first switch comprises a first transistor; and
the second switch comprises a second transistor.

9. The method of claim 8, wherein:
the third switch comprises a third transistor; and
the fourth switch comprises a fourth transistor.

10. The method of claim 1, wherein the first and second diodes comprise flyback diodes.

11. A method for testing a multiple-phase circuit comprising an inverter coupled to an electric motor, the method comprising:
activating first and second switches of a plurality of switches in the inverter, the first and second switches having respective first and second diodes coupled thereto;
monitoring current flow through the first and second switches while the first and second switches are activated;
deactivating the first and second switches;
monitoring current flow through respective diodes coupled to a third switch and a fourth switch of the plurality of switches after the deactivating of the first and second switches, wherein the first and second switches and the respective diodes coupled to the third and fourth switches are associated with a first set of a plurality of windings; and
generating a signal representative of a lack of an open circuit amongst the first and second switches, the respective diodes coupled to the third and fourth switches, and the first set of the plurality of the windings if the current flow through the first and second switches when the first and second switches are activated is greater than a first predetermined threshold and the current flow through the respective diodes coupled to the third and fourth switches after the deactivating of the first and second switches is greater than a second predetermined threshold.

12. The method of claim 11, further comprising:
generating a signal representative of a presence of an open circuit amongst the first and second switches, the respective diodes coupled to the third and fourth switches, and the first set of the plurality of the windings if the current flow through the first and second switches when the first and second switches are activated is not greater than a first predetermined threshold and the current flow through the respective diodes coupled to the third and fourth switches after the deactivating of the first and second switches is not greater than a second predetermined threshold.

13. The method of claim 11, wherein the multiple phase circuit is on-board an automobile, and the activating and the deactivating of the first and second switches and the monitoring of the current are performed by a processing system on-board the automobile.

14. The method of claim 11, wherein:
the plurality of switches comprises a plurality of transistors;
the first switch comprises a first transistor;
the second switch comprises a second transistor;
the third switch comprises a third transistor; and
the fourth switch comprises a fourth transistor.

15. The method of claim 11, wherein the first and second diodes comprise flyback diodes.

16. A method for testing a multiple-phase circuit comprising an inverter coupled to an electric motor, the method comprising:
activating first and second switches of a plurality of switches in the inverter, the first and second switches having respective first and second diodes coupled thereto;
monitoring current flow through the first and second switches while the first and second switches are activated;
deactivating the first and second switches;
monitoring current flow through respective diodes coupled to a third switch and a fourth switch of the plurality of switches after the deactivating of the first and second switches, wherein the first and second switches and the respective diodes coupled to the third and fourth switches are associated with a first set of a plurality of windings; and
generating a signal representative of a presence of an open circuit within at least one of the first and second switches and the lack of an open circuit amongst the respective diodes coupled to the third and fourth switches and the first set of the plurality of the windings if the current flow through the first and second switches when the first and second switches are activated is not greater than a first predetermined threshold and the current flow through the respective diodes coupled to the third and fourth switches after the deactivating of the first and second switches is greater than a second predetermined threshold.

17. The method of claim 16, further comprising:
generating a signal representative of a lack of an open circuit within the first set of the plurality of the windings and the presence of an open circuit amongst the respective diodes coupled to the third and fourth switches if the current flow through the first and second switches when the first and second switches are activated is greater than a first predetermined threshold and the current flow through the respective diodes coupled to the third and fourth switches after the deactivating of the first and second switches is not greater than a second predetermined threshold.

18. The method of claim 16, wherein the multiple phase circuit is on-board an automobile, and the activating and the deactivating of the first and second switches and the monitoring of the current are performed by a processing system on-board the automobile.

19. The method of claim 16, wherein:
the plurality of switches comprises a plurality of transistors;
the first switch comprises a first transistor;
the second switch comprises a second transistor;
the third switch comprises a third transistor; and
the fourth switch comprises a fourth transistor.

20. The method of claim 16, wherein the first and second diodes comprise flyback diodes.

* * * * *